United States Patent
Aggarwal et al.

(10) Patent No.: US 10,804,332 B2
(45) Date of Patent: Oct. 13, 2020

(54) DISPLAY, CIRCUIT ARRANGEMENT FOR A DISPLAY AND METHOD OF OPERATING A DISPLAY

(71) Applicant: OSRAM Opto Semiconductors GmbH, Regensburg (DE)

(72) Inventors: Anant Aggarwal, Waltham, MA (US); Alireza Safaee, Cupertino, CA (US)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 24 days.

(21) Appl. No.: 16/194,238

(22) Filed: Nov. 16, 2018

(65) Prior Publication Data

US 2020/0161377 A1 May 21, 2020

(51) Int. Cl.
- *H01L 27/32* (2006.01)
- *H01L 27/15* (2006.01)
- *G09G 3/3283* (2016.01)
- *G09G 3/3216* (2016.01)

(52) U.S. Cl.
CPC ......... *H01L 27/322* (2013.01); *G09G 3/3216* (2013.01); *G09G 3/3283* (2013.01); *H01L 27/156* (2013.01); *H01L 27/3246* (2013.01)

(58) Field of Classification Search
USPC .......................................................... 345/83
See application file for complete search history.

(56) References Cited

U.S. PATENT DOCUMENTS

| | | | | |
|---|---|---|---|---|
| 5,613,010 A | * | 3/1997 | Heyl | H03F 3/2173 330/10 |
| 2002/0175887 A1 | * | 11/2002 | Yamazaki | G09G 3/36 345/87 |
| 2003/0122806 A1 | * | 7/2003 | Edge | H04N 1/6011 345/204 |
| 2004/0085025 A1 | * | 5/2004 | Maede | G09G 3/3283 315/169.3 |
| 2004/0263437 A1 | * | 12/2004 | Hattori | G11C 27/028 345/76 |
| 2005/0017778 A1 | | 1/2005 | Nogawa et al. | |
| 2005/0052141 A1 | * | 3/2005 | Thielemans | G09G 3/3216 315/169.3 |
| 2005/0052373 A1 | | 3/2005 | Devos et al. | |
| 2006/0001613 A1 | * | 1/2006 | Routley | G09G 3/3216 345/76 |
| 2006/0139263 A1 | * | 6/2006 | Choi | G09G 3/3283 345/76 |
| 2008/0122758 A1 | * | 5/2008 | Kim | G09G 3/3233 345/76 |
| 2011/0109228 A1 | | 5/2011 | Shimomura et al. | |

(Continued)

*Primary Examiner* — Chineyere D Wills-Burns
(74) *Attorney, Agent, or Firm* — Slater Matsil, LLP

(57) ABSTRACT

A display, a circuit arrangement for a display and a method of operating a display are disclosed. In an embodiment a display includes a voltage supply and a plurality of pixels. Each pixel includes a given number of light emitters, the light emitters being arranged in parallel electric lines with a light emitter per electric line, wherein the voltage supply is adapted to provide an electric voltage to each of the parallel electric lines. Each electric line comprises a current control element, wherein the current control element of an electric line is configured to control an electric current flowing through the light emitter arranged in the electric line.

20 Claims, 4 Drawing Sheets

(56) References Cited

U.S. PATENT DOCUMENTS

| | | |
|---|---|---|
| 2013/0099681 A1 | 4/2013 | Williams et al. |
| 2016/0111036 A1* | 4/2016 | Wang .................. G09G 3/3648 345/691 |
| 2017/0039932 A1* | 2/2017 | Staudenmaier ........ G09G 5/006 |
| 2017/0154578 A1* | 6/2017 | In ......................... G09G 3/3283 |
| 2018/0240397 A1* | 8/2018 | Hara ...................... G06F 3/048 |

* cited by examiner

US 10,804,332 B2

DISPLAY, CIRCUIT ARRANGEMENT FOR A DISPLAY AND METHOD OF OPERATING A DISPLAY

TECHNICAL FIELD

The present disclosure relates to displays, circuit arrangements for a display and methods of operating a display.

BACKGROUND

Displays, such as, for example, video walls, may comprise a plurality of pixels arranged in an array-like structure. Each pixel of the display may comprise a given number of LEDs which are very close to but still separated from each other. Each pixel may, for example, comprise three LEDs with one LED emitting red light, one LED emitting green light and one LED emitting blue light. Such a pixel is sometimes called RGB LED pixel, where RGB means red, green and blue. At a common viewing distance, the separate LEDs of a pixel are usually indistinguishable for the human eye. In dependence on the operation of the LEDs of a pixel, a desired color can be generated. All the pixels together arranged in the display surface may conform the color image.

For a display made of a plurality of pixels, the trend currently moves toward smaller pixels, more color levels and faster refresh rates of the pixels. This may result in faster operations and higher switching frequencies of the display. Parasitic capacitances, for example, in the pn-junctions of the LEDs inside each pixel or in the electric circuit of the display, may not be huge, but may add up quickly, in particular when the display comprises a large amount of LEDs and when the display operates at a high switching frequency. The parasitic capacitances may generate undesirable visual effects. Such effects may appear as unwanted light from some pixels which are supposed to be dark, and such visual effects are also known as ghosting effects. These effects are also more prominent at faster switching operations. There is a need for an effective display that can operate at high switching speeds with low or even no ghosting effects.

SUMMARY

Embodiments provide displays, circuit arrangements, and methods of operating a display. In some examples, a display comprises a voltage supply, and a plurality of pixels, each pixel comprising a given number of light emitters, the light emitters of a pixel being arranged in parallel electric lines with a light emitter per electric line, the voltage supply being adapted to provide an electric voltage to each of the parallel electric lines, and each electric line comprising a current control element adapted to control an electric current flowing through the light emitter arranged in the electric line.

Each of the light emitter may be an LED. The light emitters of a pixel may be of different types. For example, a pixel may include one LED adapted to emit red light, another LED adapted to emit green light, and a further LED adapted to emit blue light. The pixel may therefore be a so-called RGB LED pixel, where R stands for red, G stands for green and B stands for blue.

In accordance with the mentioned example, each pixel comprises a given number of light emitters arranged in parallel electric lines, and each electric line further includes a current control element, such as a current source, in order to control the electric current flowing through the light emitter of the same electric line. Each pixel therefore comprises a dedicated current control element for controlling the current flow through each light emitter of the pixel.

In some examples, each current control element is a PWM-controlled current control element and in particular a PWM-controlled current source. In operation, the current control element may provide a fixed level of electric current through the electric line and thus through the light emitter arranged in the electric line of the current control element. The light intensity of the light provided by the light emitter may then be controlled with regard to the electric current through the electric line.

In some examples, each pixel comprises a PWM signal generator for each current control element. The PWM signal generator may be adapted to provide a PWM signal to the current control element by which the current control element is operated in a pulse with modulated fashion.

In some examples, the display comprises a controller, in particular a tile controller, the tile controller being connected to at least one row of pixels, the pixels of the row of pixels being arranged in series, such that the pixel of the row of pixels receive the data from a preceding pixel of the row of pixels and provides data to a subsequent pixel of the row of pixels, and such that a first pixel of the row of pixels receives data from the controller and a last pixel from the row of pixels provides data to the controller.

In some examples, the controller of the display may be connected to N rows of pixels, each with M pixels, in particular RGB LED pixels, connected in cascade. In each row, the M pixels may in particular be connected to the controller in a daisy-chain-configuration.

The controller may in some examples be a tile controller which receives tile data and a synchronization signal from a top level display controller. The video input data, such as HDMI or other types of video data, may enter the top level display controller which is in charge of providing the data to a set of tile controllers. Each of the tile controllers may be connected to N rows of pixels, each with M pixels connected to the respective tile controllers in a cascade. Having the concept of tiles allows more flexibility in the aspect ratio of a display. It is, for example, possible to mount tiles on curved areas and also to have non-rectangular display shapes. The synchronization signal generated by the top level display controller may be used to ensure that all images shown on the tiles are in full synchronization.

The tile controller may generate two signals which are sent to the pixels connected to the tile controller. The first signal may be a clock signal which may act in particular as a clock signal for SPI interfaces of the pixels. The second signal may be a frame start signal which may indicate to a pixel to update the states of the light emitters. The frame start signal may be generated from the synchronization signal provided by the top level display controller.

In some examples, the tile controller and/or at least one controller in each row of pixels may be configured to carry out at least one of the following: an integrity check on a received data signal, such as a stream of bytes or bits, for example, by analyzing a check sum, such as a cyclic redundancy checksum, included in the data signal, to generate a check sum from at least some of the data contained in the data signal and to append the generated checksum to the data signal. The data signal with the appended checksum may be sent out to a subsequent controller in the row of pixels.

In some examples, the tile controller may have one or more SPI interfaces per each row of pixels. An SPI output interface may be used to send data to the pixels and an SPI input interface may be used to read back data from the pixels. The SPI input may be used as a data feedback channel which allows detecting any error in the data and correcting it before the arrival of the next frame start signal. Such a correction may happen several times before the next image is to be shown. The error detection may include carrying out an integrity check on the data. The integrity check may include analyzing a checksum obtained from the data.

In some examples, a pixel comprises an input controller adapted to use a communication interface, such as SPI, to receive data from a controller of the display or another pixel.

In some examples, each pixel may comprise an output controller adapted to use a communication interface to send data to the controller of the display or another pixel. This communication interface may also be SPI or based on SPI.

In some examples, each pixel comprises an input controller adapted to receive at least one of a clock signal and a frame start signal provided by a controller of the display, in particular the tile controller of the display.

In some examples, a controller of the display is adapted to provide data to at least one pixel, preferably to a row of pixels, the data comprising information related to the operation of the at least one pixel and preferably to the row of pixels. The data may include duty cycle information for PWM signal generation used to control the current control elements of the at least one pixel. This allows generating a PWM signal required to control the operation of the current control elements of a pixel inside each pixel, in a synchronized fashion between all the pixels.

Only the data which is indicative of the duty cycle required for the operation of the PWM driven current control elements within a pixel may be sent to the pixel, whereas the actual PWM signal in time domain can be generated within the pixel. The duty cycle information, in particular the duty ratio numbers, can be provided to each pixel by use of, for example, three 12-bit numbers, whereas the provision of the actual PWM signals in time domain to a pixel may require $3 \times 2^{12} = 12288$ bits. A much faster data rate and possibility of having more LEDs in a row can therefore be achieved.

The provision of the data with the duty cycle information to each pixel also allows generating drive currents for the light emitters of a pixel within the pixel and thus at the point of use. The harmonic-rich power current does not travel in the circuit, for example, in a printed circuit board, outside a pixel. Rather, only low power signals may therefore travel in the circuit outside the pixel.

In some examples, an input controller as well as an output controller of a pixel may use SPI for communication. The pixels may therefore be connected to any SPI interface directly. An advantage is that the speed of SPI may be much higher than a usual refresh rate of a display.

In some examples, an input controller of a pixel is adapted to receive the data from a controller of the display, such as a tile controller, and to convert the data to a stream of n-bits and to send the stream of n-bits to a number of m-bit shift registers connected in series, each of the shift registers being associated with a current control element of the pixel, each shift register being connected with an associated m-bit latch and adapted to provide the stored data to the associated m-bit latch upon reception of a frame start signal provided to the pixel.

In some examples, each pixel comprises a counter adapted to be triggered in response to the reception of a clock signal provided to the pixel.

In some examples, each pixel further comprises a PWM signal generator for controlling the operation of an associated current control element of the pixel, the PWM generator being adapted to determine a PWM signal for operating the associated current control element of the pixel based on the data stored in an associated m-latch and on a counter value received from the counter. The counter may, for example, be reset and start counting up using a clock signal provided to the respective pixel. When a frame signal arrives at the pixel, the stored values in the shift registers may be latched to the latches. The PWM signal generator may compare the latched data provided to the PWM signal generator and compare it with a counter number to generate a corresponding PWM signal. The PWM signal may be used to control a current control element and, consequently, the light emitter in the electric line of the current control element.

In some examples, each pixel comprises a calibration module which is configured to calibrate the colors provided by the light emitters of the respective pixel.

In some embodiments, an input controller of a pixel is adapted to receive data and to convert the data to a stream of n-bits and to send the stream of n-bits to a number of m-bit shift registers connected in series, each of the shift registers being associated with a current control element of the pixel, each shift register being connected with an associated m-bit latch and adapted to provide the stored data to the associated m-bit latch upon a reception of a frame start signal provided to the pixel, wherein a 1-bit shift register is serially connected to the series of m-bit shift registers, the 1-bit shift register being connected with an associated 1-bit latch and adapted to provide stored data to the associated 1-bit latch upon reception of a frame start signal provided to the pixel, the 1-bit latch being further connected to a command interpreter which can address and write data to a calibration module, each m-bit latch being connected to a de-multiplexer which is configured to provide input to the calibration memory.

In some examples, each de-multiplexer and the calibration memory provide input to a matrix multiplier unit adapted to generate PWM signals for controlling the current control elements of the pixels based on the input provided from the de-multiplexer and the calibration module.

In some examples, each pixel of the display comprises at least one current control element for providing a current reference to the current control elements of the pixel.

In some embodiments, each pixel comprises for each of its current control elements a current reference element for providing a current reference to the associated current control element, each pixel further comprising a control module for controlling individually each current reference element. This provides the possibility of adjusting the current control elements for the different light emitters of a pixel separately. As each light emitter is adapted to emit light at a different wavelength, the different colors provided by a pixel can be adjusted separately. The colors provided by a pixel can therefore be calibrated on the level of a pixel. The possibility of adjusting the current sources separately provides an extra degree of freedom and allows for a fine tuning under software control without slowing down the display or requiring extra hardware.

In some examples, each current reference may provide up to 256 different levels. The levels can be linearly spaced or nonlinearly as needed and the levels may, for example, be changed via a command provided by use of the SPI interface to a respective pixel.

An adjustment of the different colors of a pixel and, more generally, an adjustment of the different colors of the plurality of pixels of the display may take place in dependence on the light conditions in the environment of a display. For example, the color settings may be different during a bright day with sunlight and during the night.

In some examples, each pixel comprises an error detection module adapted to detect an error in data receive by the pixel, and each pixel comprises an output controller adapted to send an error data signal in response to the detection of the error. Each pixel may therefore be provided with a data feedback mechanism. When combined with a high data rate for providing the duty cycle numbers for PWM generation to the pixels, there can be sufficient time to check the integrity and correctness of the data sent to the pixel by use of the pixel's error detection module, for example, following standard data checking methods in serial communications, such as check sums, and there may be sufficient time to correct the data sent to the pixels several times before the next image is to be shown. Error detection may include carrying out an integrity check on data. The integrity check may include analyzing a check sum, such as a cyclic redundancy checksum, included in the data.

In some examples, the display is a video wall or a LED-wall. In some examples, the display may be a display of a computer screen, a TV-screen, a display of a mobile or wearable electronic device, such as a smartphone, a tablet, a smartwatch or the like.

In some examples, a circuit arrangement comprises a voltage supply, and a plurality of pixels, each pixel comprises a given number of light emitters. The light emitters are arranged in parallel electric lines with a light emitter per electric line, and the voltage supply is adapted to provide an electric voltage to each of the parallel electric lines. Each electric line comprises a current control element adapted to control an electric current flowing through the light emitter arranged in the electric line.

In some examples, a method of operating a display with a plurality of pixels comprises, for each pixel, the step of providing a voltage to a given number of parallel electric lines with each electric line comprising a light emitter and a PWM-controlled current control element adapted to control an electric current flowing through the electric line. The method may further comprise the step of generating a PWM signal for each current control element by use of at least one component incorporated in the pixel. Moreover, the method may comprise the step of providing to each current control element of the respective pixel the PWM signal generated for the respective current control element.

In some examples, the at least one component is adapted to generate the PWM signal in response to the reception of an input data signal provided to the pixel, the input data signal being indicative of the duty cycle of each PWM signal to be applied to the light emitters of the pixels.

In some examples, the parameters, such as M, N, l, m, n mentioned to indicate a number of rows (N-rows), a number of pixels (M-pixels), or a number of bits, l-bits, m-bits, n-bits, are integer numbers, such as 1, 2, 3, 4, and so one.

DETAILED DESCRIPTION OF ILLUSTRATIVE EMBODIMENTS

In the following description of examples, reference is made to the accompanying drawings in which are shown by way of illustration specific examples that can be practiced. It is to be understood that other examples can be used, and structural changes can be made without departing from the scope of the various examples.

Figure 1:
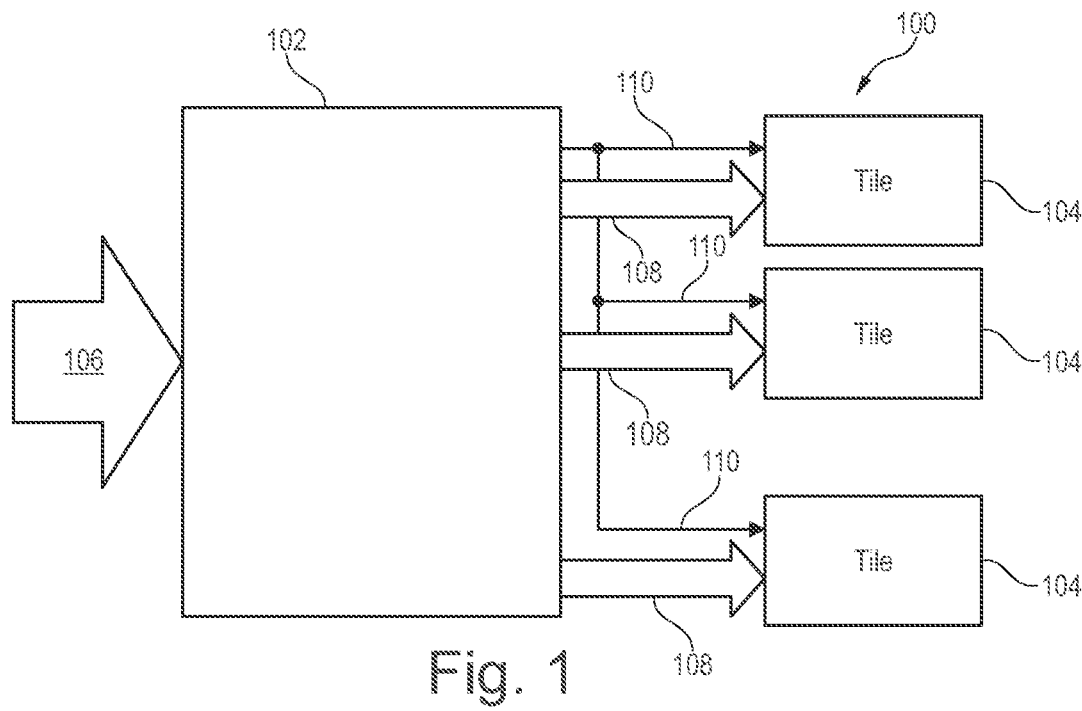
FIG. 1 is a block diagram of a controller set-up of a display according to an embodiment.

FIG. 1 illustrates a block diagram of a controller set-up of a display 100 comprising a top level display controller 102 and several tile controllers 104. Video input data 106, for example, in a HDMI-format, is provided to the top level display controller which is in charge of dividing the data and sending the divided data 108 to the individual tiles. The top level display controller 102 also generates a synchronization signal 110, which is also named as "sync signal" and which ensures that all the images shown on the tiles are in full synchronization.

Figure 2:
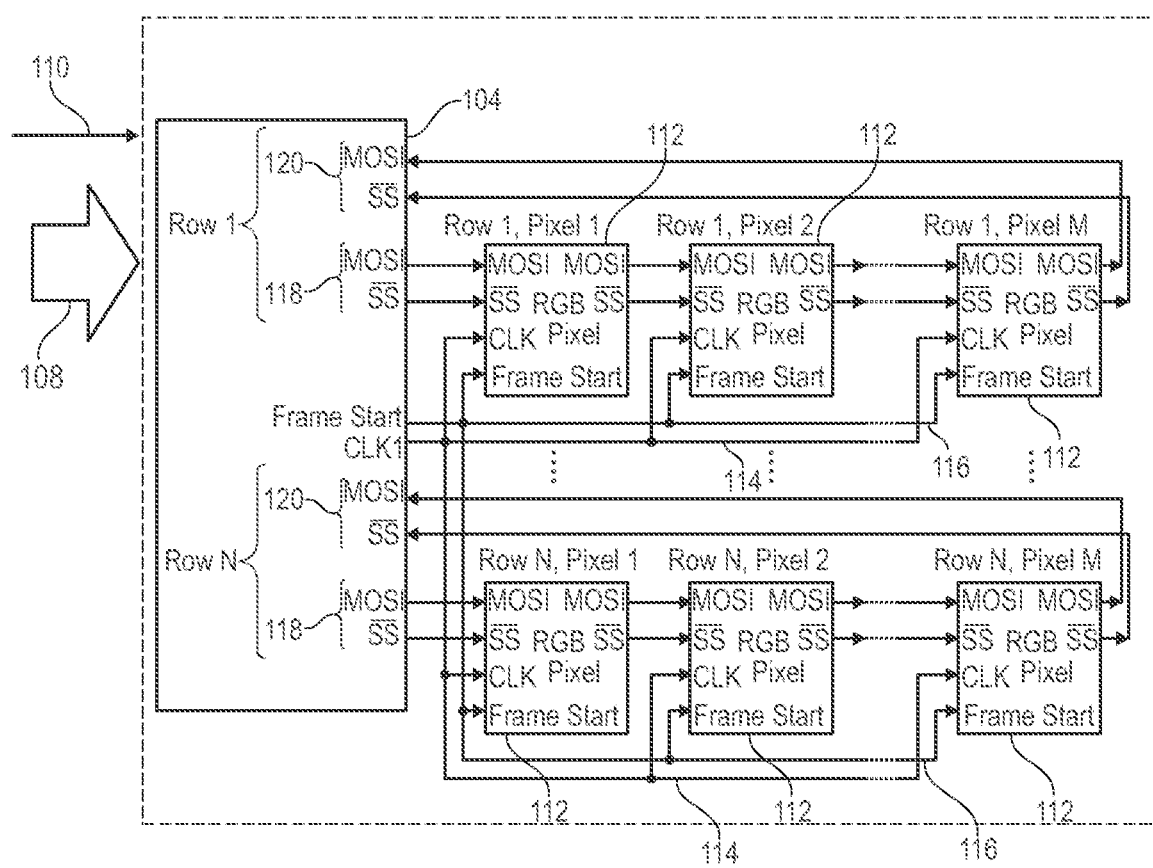
FIG. 2 is a block diagram of a tile controller set-up of a display according to an embodiment.

Each of the tile controllers 104 is connected to N rows of pixels, each pixel with M RGB pixels connected in cascade. FIG. 2 illustrates an example block diagram of a tile controller set-up of the display 100. Each of the N rows of pixels comprises M RGB pixels 112. The tile controller 104 generates a clock signal, the so-called "CLK1 signal", which acts as the clock signal for SPI interfaces, and a so-called "frame start" signal 116 which tells all pixels 112 to update their LED states with the data stored in them. The frame start signal 116 is generated from the synchronization signal 110.

The tile controller 104 comprises two SPI interfaces for each row of pixels 112. A SPI output 118 is adapted to send data to the pixels 112 and a SPI input 120 is adapted to read back data provided by the pixels 112. The SPI input 120 may be regarded as a data feedback channel which allows detecting any error in the data and correcting the error before the arrival of the next frame start signal 116 via the SPI output 118. A data correction can be carried out several times before the next image is to be shown by use of the pixel 112.

Via the SPI input 118 and SPI output 120 of the tile controller 104, a master output slave input (MOSI) signal and a slave select signal $\overline{SS}$ is sent to and received from the pixels 112 of a row. As shown in FIG. 2, each pixel comprises a MOSI input and a MOSI output in order to provide the MOSI-signal to a subsequent pixel 112 of the respective row. Correspondingly, each pixel 112 comprises an $\overline{SS}$-input and an $\overline{SS}$-output in order to pass the select signal to a preceding pixel. For simplicity SS is written in the following as synonym for $\overline{SS}$. The last pixel, pixel M, of a row of pixels passes the MOSI-signal and the SS-output signal to the SPI output 120 of the tile controller 104. FIG. 2 also shows that the clock signal 114 and the frame start signal 116 are provided to each pixel.

Figure 3:
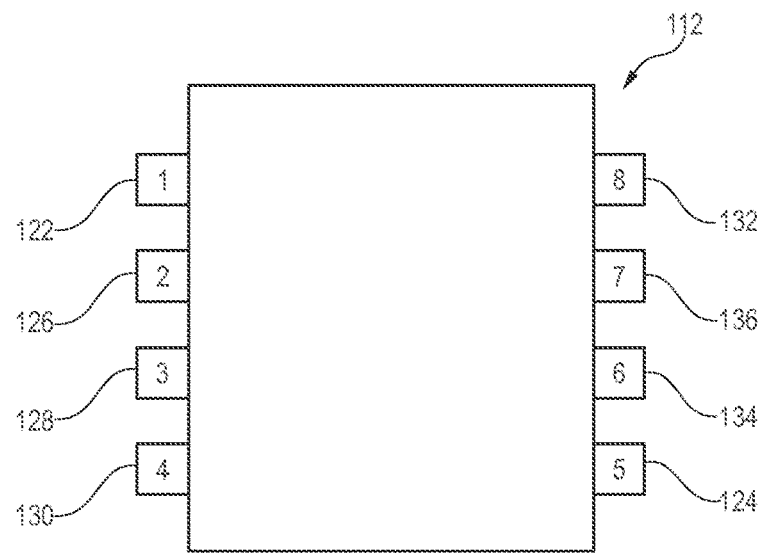
FIG. 3 is a block diagram of a pixel pinout according to an embodiment.

FIG. 3 illustrates a block diagram of a pinout of a pixel 112. The pixel 112 comprises four pins including a pin with number 1, pin 122, for providing a voltage signal $V_{cc}$ with respect to ground which is received on pin number 5, pin 124. There are four input pins with numbers 2, 3, 4 and 8. Specifically, pin 126 is used as input for the MOSI-signal, pin 128 is used as input for the $\overline{SS}$-signal, pin 130 is used as input for the clock signal and pin 132 is used as input for the frame start signal. There are also two output pins, namely pins number 6 and 7. Specifically, pin 134 is used as output for the $\overline{SS}$-signal and pin 136 is used as output for the MOSI-signal. The low amount of pins helps to increase the reliability of a pixel and to reduce the complexity of a wire bonding inside the pixel 112.

Figure 4:
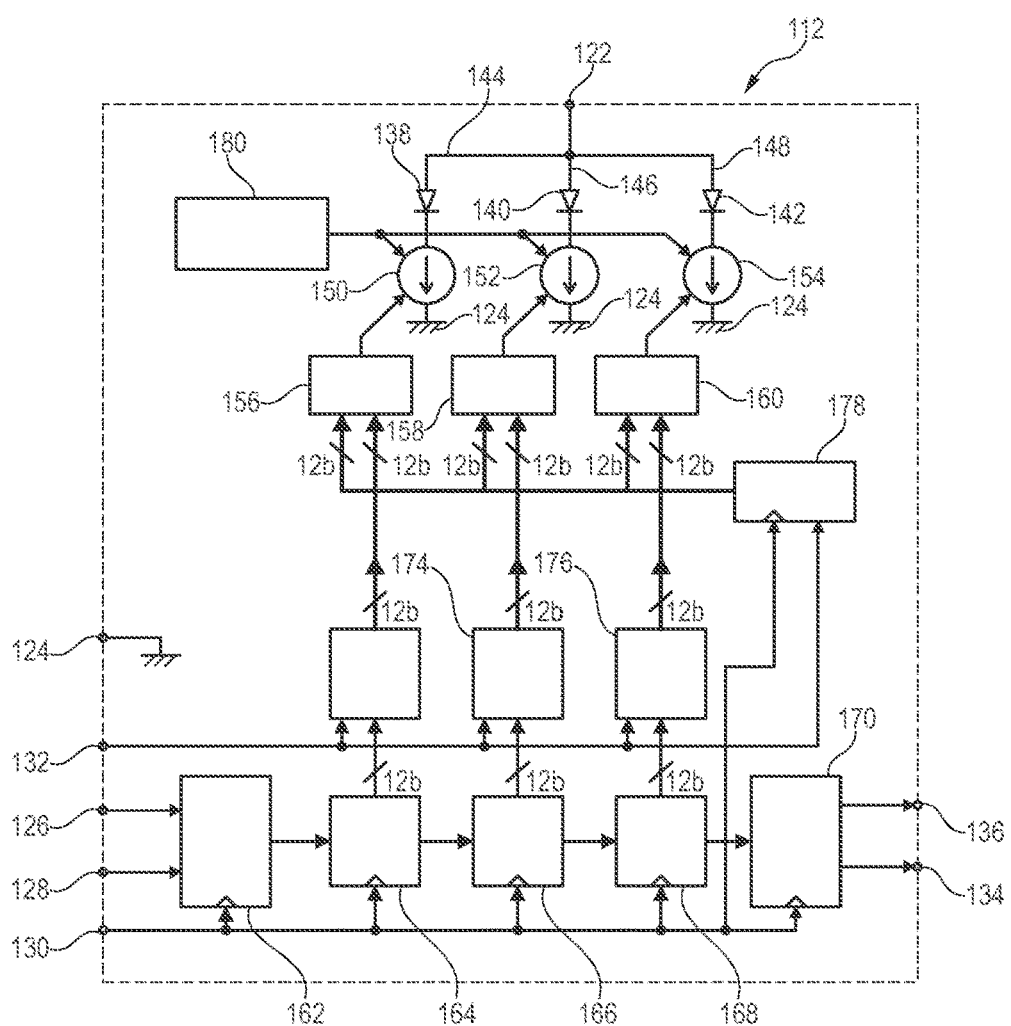
FIG. 4 is a block diagram of a pixel according to an embodiment.

FIG. 4 illustrates in form of a block diagram an internal electronic set-up of an RGB LED pixel, according to some examples. The pixel 112 comprises three light emitters, here three LEDs 138, 140 and 142. The LED 138 may be configured to emit red light. The LED 140 may be configured to emit green light. The LED 142 may be configured to emit blue light. The pixel is therefore an RGB LED pixel which can provide a great variety of colors by adding together the light emitted by the three LEDs 138-142 in accordance with the RGB color model.

Each of the LEDs 138-142 is arranged in an electric line 144, 146, 148, which are parallel with respect to each other. Each electric line further comprises a current control element, here current sources 150, 152, 154. Each current source is configured to control an electric current flowing through the corresponding LED of the same electric line. Furthermore, the electric voltage is provided on pin 122 (see also in FIG. 3) with respect to ground 124 (see also in FIG. 3) to the electric lines 150, 152, 154.

Each current source 150, 152, 154 is a PWM-controlled current source and connected to an associated PWM signal generator. Each PWM signal generator 156-160 provides a PWM signal for controlling the operation of the current sources 150, 152, 154.

The pixel 112 further comprises an input controller 162 which is configured to receive input from pin 126 (MOSI-signal) and pin 128 ($\overline{SS}$-signal). Three 12-bit registers 164, 166, 168 are connected in series to the input controller 162. Furthermore, an output controller 170 is connected to the last shift register 168 of the series. The output controller 170 can communicate with a subsequent pixel of a row of pixels or with the tile controller 104 (see FIG. 2) by use of a MOSI-signal and by use of a $\overline{SS}$-signal and is thus connected to the corresponding pins 136 and 134.

The data, for example, in packets of 5 bytes per pixel, is provided by the tile controller 104 (see FIG. 2) to the pixel 112, in particular by use of at least one of the pins 126 and 128, using the SPI-interface.

The data provided to the tile controller 104 may, for example, have the following format:

| Size (Bytes) | 1 Byte | 1 Byte | 1 Byte | 0-N Bytes | 1 Byte |
|---|---|---|---|---|---|
| Content | Message Length | Cmd ID | Item | Data Bytes | CRC |

The "Message Length"-byte may specify the number of bytes that are going to be transmitted.

The "Cmd ID"-byte (for Command ID) may specify a "read", "write" or "acknowledge reception" command.

The "Item"-byte may specify predefined memory locations for items like color, intensity, or the like.

The "Data Bytes"-byte(s) may depend on command and may vary from 0 to N bytes.

The "CRC"-byte may provide a checksum of the complete message. The communication protocol may ensure that the CRC-byte is appended to every stream that is sent out. The "CRC"-byte may relate to an 8 bit cyclic random checksum, for example, in form of a CRC polynomial $x^8+x^5+x^4+1$. The "CRC"-byte may be used for checking data integrity. The data packet from the tile controller 104 may travel through the pixels connected to the tile controller 104.

There may also be a "timeout" specified, which may define the maximum time between bytes of a message and support the detection of a broken down transmission.

The data is converted by the input controller 162 to a stream of, for example, eight bit data sent out serially with clock speed applied via pin 130 as shown in FIG. 4 to the input controller 162, the shift registers 164, 166, 168, and the output controller 170. The output controller 170 is adapted to convert the serial data stream provided by the preceding shift register 168 to a byte stream and to send out the byte stream via an SPI interface over at least one of the pins 134 and 136. For example, 36 bits out of the 40 bits in the 5 bytes provided per pixel may be used as color duty ratios for the three current sources 156, 158, 160 of the LEDs 150, 152 and 154.

When a frame start signal, provided via pin 132, arrives, the stored values in the shift registers 164, 166 and 168 are latched into three 12-bit latches 172, 174 and 176. Specifically, the shift register 164 provides a stored value to the 12-bit latch 172. The shift register 166 provides the stored value to 12-bit latch 174, and the shift register 168 provides the stored value to latch 176. At the same time, a counter 178 is reset in response to the reception of the frame start signal. The counter 178 further starts using the block signal provided via pin 130 as clock input.

The latched data for a respective color is compared by the respective PWM signal generator 156, 158 and 160 with a counter number provided by the counter 178 to the respective PWM signal generator. Based on the result of this comparison, each PWM signal generator 156, 158 and 160 generates the corresponding PWM signal which is used to control the operation of the respective current source 150, 152 and 154. Each current source 150, 152 and 154 obtains a reference current value from a current reference 180 which can be one current reference as shown in FIG. 4 and which can be shared between the three current sources 150, 152 and 154. As an alternative, there can be a dedicated current reference for each current source (not shown). The current reference 180 is fully internal, can be implemented in software or hardware. Thus, it does not need an element which is external to the pin 112.

Figure 5:
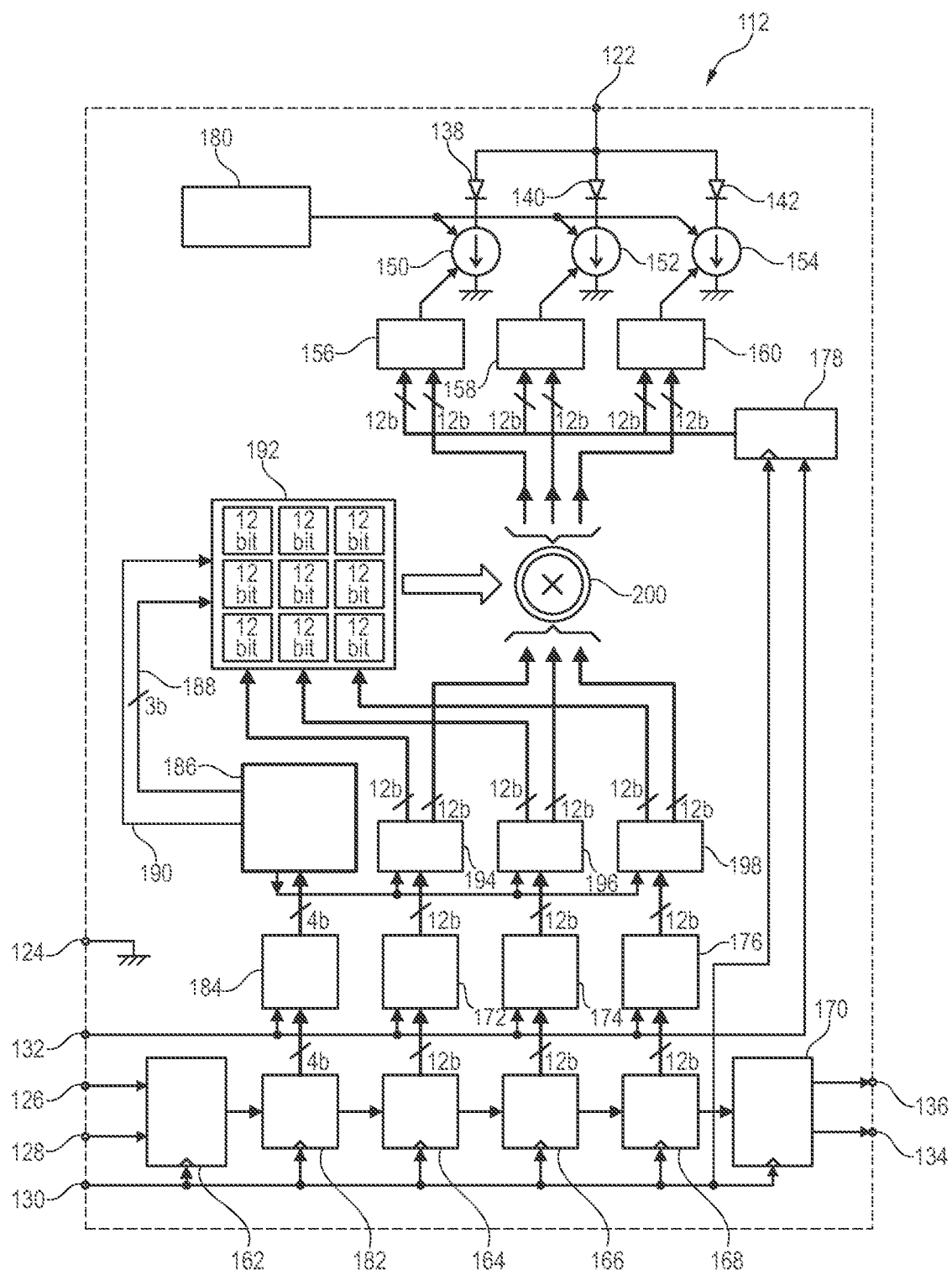
FIG. 5 is a block diagram of a pixel according to an embodiment.

FIG. 5 illustrates a block diagram of an electronic set-up of a pixel 112, according to various examples. The set-up of FIG. 5 is based on the set-up of FIG. 4. Therefore, the additional items and functions of the setup of FIG. 5 are explained in the following.

In the data provided to the input controller 162 the SPI interface, a given number of bits, here for example 4 bits, is used as commands for a color calibration of the LEDs 138, 140 and 142. A 4-bit shift register 182 is added to the series of shift registers 164, 166, 168 and placed subsequent to the input controller 162. The 4-bit shift register 182 can receive a bit stream serially from the input controller 162 and pass them to the subsequent 12-bit shift registers 164, 166 and 168. The existing 4-bit in the shift register 182 is provided to a 4-bit latch 184 in parallel format. When the frame start signal arrives via pin 132 (see FIG. 3) the 4-bit information from the 4-bit shift register 182 is latched and passed to a command interpreter 186.

The command interpreter 186 can address via at least one communication channel 188 a 9×12-bit calibration memory 192. Furthermore, the command interpreter 186 can write, via at least a second communication channel 190, to the calibration memory 192. The calibration memory 192 comprises nine memory locations of 12-bits each, so that the calibration memory 192 can store a 3×3 calibration matrix. This may be used to store calibration data, for example, at the end of an assembly line. The calibration data stored in the 3×3 calibration matrix may help to ensure a consistent optical output from all pixels.

The command interpreter 184 is configured to decode the 4-bit command received via latch 184 from the shift register 182. If the command received by the command interpreter 186 indicates that the 36 bit data stored in the three 12-bit shift registers 164, 166 and 168 is RGB LED brightness data, the command interpreter 168 selects the de-multiplexers 194, 196, 198 arranged subsequent to the latches 172, 174 and 176 as shown in FIG. 5 to pass the data to a matrix multiplier unit 200.

If the command received by the command interpreter 186 indicates that the 36-bit data stored in the three shift registers 164, 166, 168 corresponds to a 36-bit calibration data for a first row of the calibration matrix, the command interpreter 186 selects the de-multiplexers 194, 196, 198 to pass this data to be written in the first row of the calibration memory 192.

If the command provided to the command interpreter 186 indicates that the stored 36-bit data corresponds to a 36-bit calibration data for a second row of the calibration matrix in the calibration memory 192, the command interpreter 186 selects the de-multiplexers 194, 196 and 198 to pass the data to be written in the second row of the calibration memory 192.

If the command indicates that the stored 36-bit data corresponds to a 36-bit calibration data for a third row of the calibration matrix of the calibration memory, the command interpreter 186 selects the de-multiplexers 194, 196 and 198 to pass the data to be written in the third row of the calibration memory 192. Other commands are ignored.

The de-multiplexers 194, 196 and 198 therefore direct, in a controlled way by use of the command integrator 186, the 36-bits provided by the shift registers 164, 166 and 168 either to the calibration memory 192 or the matrix multiplier unit. The matrix multiplier unit 200 multiplies the 3×1 RGB array provided by the de-multiplexers 194, 196 and 198 with the 3×3 calibration matrix to generate a 3×1 RGB array which is calibrated based on the data stored in the calibration memory. The calibrated 3×1 RGB array is passed to the 3 PWM signal generators 156, 158 and 160 which may include three 12-bits comparators that are not shown to generate PWM-signals to control the current sources 150, 152 and 154 as explained before using also a counter number provided from counter 178.

The pixel according to FIG. 5 allows calibrating the LEDs 150, 152 and 154 with regard to the emitted color and the information employed for calibration is stored locally inside each pixel 112. A change in a firmware running in the tile controller 104 or the top level display controller 102 may therefore be minimal and the calibration can be totally hidden from the hardware and/or software connected to the display 100. Furthermore, as the calibration can take place inside the pixel 112, no extra circuitry is required. Furthermore, the calibration is fast and can be done for the entire display and in particular within all pixels of a display in the time needed for three frame times, for example, and depending on the light speed of the calibration memory 192.

As outlined above, the command interpreter 186 employs four commands for carrying out the calibration of the LEDs 150 to 154. As the commands are provided by use of a 4-bit information there are in total 16 commands (corresponding to 24) available. Thus, there are unused commands for future expansion.

Figure 6:
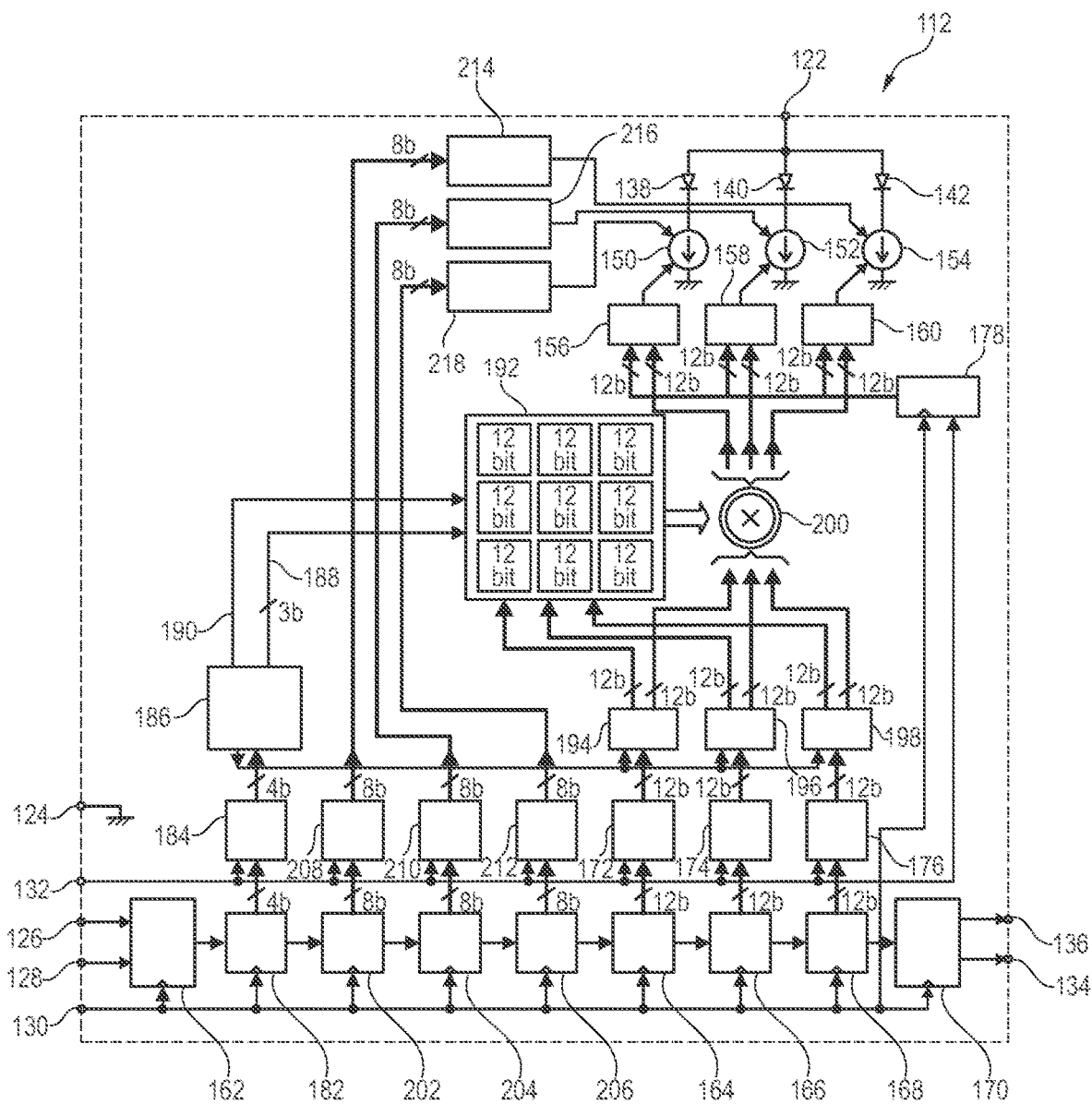
FIG. 6 is a block diagram of a pixel according to an embodiment.

FIG. 6 illustrates in a block diagram an electronic set-up of a pixel 112, according to various examples. The set-up of FIG. 6 is based on the set-up of FIG. 5, so that the additional capabilities of the set-up of FIG. 6 will be described in the following.

The set-up of FIG. 6 comprises three 8-bit shift registers 202, 204 and 206 arranged in series between the shift registers 182 and 164 as shown in FIG. 6. Each of the 8-bit shift registers 202, 204 and 206 can provide data to an associated 8-bit latch 208, 210 and 212. The data in the latches 208, 210 and 212 serves to control the level of current in the three current references 214, 216 and 218. Specifically, current reference 214 is adapted to provide a current reference to current source 154. The current reference 216 is adapted to provide a current reference to current source 152 and the current reference 218 is adapted to provide a current reference to current source 150.

The set-up of FIG. 6 therefore provides the possibility of adjusting the current sources 150, 152 and 154 for the different colors emitted by the LEDs 138, 140 and 142. Each current source can have up to 256 different levels due to the 8-bit data provided by the respective shift registers 182, 202 and 204. The levels can be linearly spaced or nonlinearly as needed.

The adjustment of the colors provides three extra degrees of freedom which allows for fine tuning under software control without slowing down the display or extra hardware. Furthermore, the light level of the display can be adjusted for differences between day and night, or between indoors and outdoors.

What is claimed is:

1. A display comprising:
   a voltage supply;
   a plurality of pixels, each pixel comprising:
      a given number of light emitters, the light emitters being arranged in parallel electric lines with a light emitter per electric line, wherein the voltage supply is adapted to provide an electric voltage to each of the parallel electric lines; and
      each electric line comprising a current control element, wherein the current control element of an electric line is configured to control an electric current flowing through the light emitter arranged in the electric line; and
   a controller being connected to at least one row of pixels, the pixels of a row of pixels being arranged in series such that a pixel of the row of pixels is configured to receive data from a preceding pixel of the row of pixels and configured to provide data to a subsequent pixel of the row of pixels, and such that a first pixel of the row of pixels is configured to receive data from the controller and a last pixel of the row of pixels configured to provide data to the controller.

2. The display of claim 1, wherein each current control element is a PWM controlled current control element.

3. The display of claim 1, wherein each pixel comprises a PWM signal generator for each current control element.

4. The display of claim 1, wherein the controller is configured to perform an integrity check on a received data signal and, in case an error in the data signal is detected via the integrity check, to correct the error prior to arrival of a frame start signal, the frame start signal being repeatedly provided to the controller.

5. The display of claim 1, wherein a pixel comprises at least one of:
   an input controller adapted to use a first communication interface to receive data from the controller of the display or another pixel; or an output controller adapted to use a second communication interface to send data to the controller of the display or another pixel, and wherein the communication interface is a Serial Peripheral Interface (SPI).

6. The display of claim 1, wherein each pixel comprises an input controller adapted to receive at least one of a clock signal and a frame start signal provided by the controller of the display.

7. The display of claim 1, wherein the controller of the display is adapted to provide data to at least one pixel, the data comprising information related to an operation of the at least one pixel.

8. The display of claim 7, wherein the data includes duty cycle information for PWM signal generation for controlling the current control elements of the at least one pixel.

9. The display of claim 7, wherein an input controller of a pixel is adapted to receive the data and to convert the data to a stream of n-bit and to send the stream of n-bit to a number of m-bit shift registers connected in series, each of the shift registers being associated with a current control element of the pixel, each shift register being connected with an associated m-bit latch and adapted to provide the stored data to the associated m-bit latch upon reception of a frame start signal provided to the pixel.

10. The display of claim 9, wherein the pixel comprises a counter adapted to triggered in response to a clock signal provided to the pixel.

11. The display of claim 7, wherein an input controller of a pixel is adapted to receive the data and to convert the data to a stream of n-bit and to send the stream of n-bit to a number of m-bit shift registers connected in series, each of the shift registers being associated with a current control element of the pixel, each shift register being connected with an associated m-bit latch and adapted to provide the stored data to the associated m-bit latch upon reception of a frame start signal provided to the pixel, wherein an 1-bit shift register is serially connected to the series of m-bit shift registers, the 1-bit shift register being connected with an associated 1-bit latch and adapted to provide stored data to the associated 1-bit latch upon reception of a frame start signal provided to the pixel, the 1-bit latch being further connected to a command interpreter which can address and write data to a calibration memory, each m-bit latch being connected to a de-multiplexer which can provide input to the calibration memory.

12. The display of claim 11, wherein each of the de-multiplexer and the calibration memory provide input to a matrix multiplier unit adapted to generate PWM signals for controlling the current control elements of the pixels based on the input provided from the de-multiplexers and the calibration memory.

13. The display of claim 1, wherein the pixel further comprises a PWM signal generator for controlling an operation of an associated current control element of the pixel, the PWM signal generator being adapted to determine a PWM signal for operating the associated current control element of the pixel based on data stored in the associated m-bit latch and on a counter value received from the counter.

14. The display of claim 1, wherein a pixel comprises a calibration module adapted to calibrate colors provided by the light emitters of the pixels.

15. The display of claim 1, wherein a pixel comprises at least one current reference element for providing a current reference to the current control elements of the pixel.

16. The display of claim 1, wherein each pixel comprises for each of its current control elements a current reference element for providing a current reference to the associated current control element, and wherein each pixel comprises a control module for controlling individually each current reference element.

17. The display of claim 1, wherein each pixel comprises an error detection module adapted to detect an error in data received by the pixel, and wherein each pixel comprises an output controller adapted to send an error data signal in response to the detection of the error.

18. A circuit arrangement for a display, the circuit arrangement comprising:
a voltage supply;
a plurality of pixels, each pixel comprising:
a given number of light emitters, the light emitters being arranged in parallel electric lines with an light emitter per electric line, wherein the voltage supply is adapted to provide an electric voltage to each of the parallel electric lines; and
each electric line comprising a current control element adapted to control an electric current flowing through the light emitter arranged in the electric line; and
a controller being connected to at least one row of pixels, the pixels of a row of pixels being arranged in series such that a pixel of the row of pixels is configured to receive data from a preceding pixel of the row of pixels and configured to provide data to a subsequent pixel of the row of pixels, and such that a first pixel of the row of pixels is configured to receive data from the controller and a last pixel of the row of pixels configured to provide data to the controller.

19. A method of operating a pixel in a display with a plurality of pixels, the method comprising:
providing a voltage to a given number of parallel electric lines, wherein each electric line comprises an light emitter and a PWM controlled current control element adapted to control an electric current flowing through the electric line;
generating a PWM signal for each current control element by using at least one component incorporated in a pixel;
providing the generated PWM signal to each current control element;
receiving, by the pixel of a row of pixels, data from a preceding pixel of the row of pixels;
providing, by the pixel of the row of pixels, data to a subsequent pixel of the row of pixels;
receiving, by a first pixel of the row of pixels, data from a controller; and
providing, by a last pixel of the row of pixels, data to the controller,
wherein the controller is connected to at least one row of pixels, and
wherein the pixels of the row of pixels are arranged in series.

20. The method of claim 19, wherein the at least one component is adapted to generate the PWM signal based in response to a reception of an input data signal provided to the pixel, and wherein the input data signal is indicative of a duty cycle of each PWM signal.

* * * * *